United States Patent
Sand

(10) Patent No.: US 7,303,976 B2
(45) Date of Patent: Dec. 4, 2007

(54) WAFER BONDING METHOD

(75) Inventor: Kirby Sand, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 115 days.

(21) Appl. No.: 11/126,485

(22) Filed: May 10, 2005

(65) Prior Publication Data

US 2006/0255454 A1    Nov. 16, 2006

(51) Int. Cl.
*H01L 21/46* (2006.01)

(52) U.S. Cl. .............. 438/455; 438/456; 438/457; 438/458; 438/460; 438/50; 438/67; 438/51; 438/107; 438/125; 257/619; 257/723

(58) Field of Classification Search ........ 438/455–458, 438/460, 50, 67, 51, 107, 125; 257/619, 257/723
See application file for complete search history.

(56) References Cited

U.S. PATENT DOCUMENTS

| | | | |
|---|---|---|---|
| 4,315,591 A | | 2/1982 | Houston |
| 5,150,196 A | * | 9/1992 | Yamamoto et al. ......... 257/729 |
| 5,729,185 A | | 3/1998 | Johnson et al. |
| 6,306,749 B1 | | 10/2001 | Lin |
| 2004/0219764 A1 | * | 11/2004 | Syllaios et al. ............ 438/456 |
| 2006/0263932 A1 | * | 11/2006 | Takeuchi .................... 438/106 |

* cited by examiner

*Primary Examiner*—Junghwa Im

(57) ABSTRACT

One embodiment of a micro-electronic device includes a substrate including micro-electronic components thereon, and a cover including a ring of sealing material secured to the substrate and a raised ring of material positioned opposite the cover from the ring of sealing material.

8 Claims, 2 Drawing Sheets

WAFER BONDING METHOD

BACKGROUND

Bonding of covers to microelectronic substrates may be conducted to environmentally seal microelectronic devices formed on the substrate. Some of the microelectronic devices may extend upwardly from an exposed surface of the substrate. Accordingly, the cover may be spaced from the substrate by a seal ring so as to reduce damage to the microelectronic devices. However, during bonding of the cover to the seal ring, the cover or the substrate may bend which may force the microelectronic devices and the cover into contact, thereby damaging the devices and/or the cover. Raising the height of the seal ring may increase the cost and/or complexity of the manufacturing process and may increases stresses on the substrate. Accordingly, it may be desirable to provide a method of bonding a cover to a substrate while reducing damage to microelectronic devices on the substrate.

DETAILED DESCRIPTION

Figure 1:
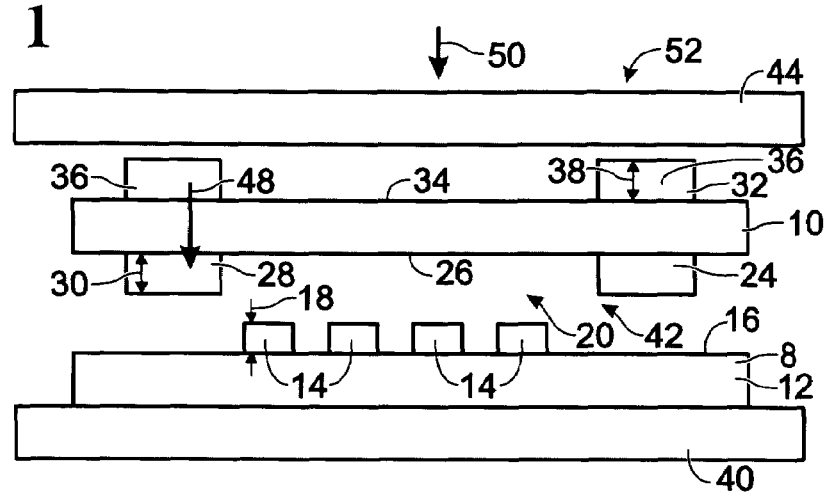
FIG. 1 shows a schematic side cross-sectional view of one embodiment of a wafer bonding method wherein a cover is positioned above a substrate.

FIG. 1 shows a schematic side cross-sectional view of one embodiment of a wafer bonding method wherein a microelectrical component 8 includes a cover 10 positioned above a substrate 12. The term "wafer bonding method" may be defined as including both wafer-scale bonding and die level bonding. Accordingly, the term "wafer bonding" is utilized herein to refer to both wafer-scale bonding and die level bonding. Cover 10 may be any type of cover utilized to cover a substrate, and in the example embodiment shown, may be a transparent cover, such as a cover manufactured of glass. Transparent may include, for example, transparent to infra red light, transparent to visible light, or the like. Substrate 12 may be any type of substrate utilized in the manufacture of semiconductor microelectronic devices, such as a silicon substrate or wafer. Microelectronic devices 14 may be formed in and/or on substrate 12 and may extend upwardly from an exposed surface 16 of substrate 12 a distance 18. Devices 14 may be any type of microelectronic devices and in the example embodiment shown may be Micro Electrical Mechanical systems (MEMs). Devices 14 may be positioned within a selected central region 20 of substrate 12 such that when cover 10 is secured to wafer 12, devices 14 will be hermetically sealed within an interior sealing region 22 (see FIG. 2) between cover 10 and wafer 12.

Cover 10 may include a seal material 24 positioned on an underside 26 thereof. Seal material 24 may define a ring 28, sometimes referred to as a stand-off, of seal material that extends continuously around selected central region 20 of substrate 12 when the seal material is sealed thereto. Seal material 24 may be formed of TEOS, Amorphous Silicon, Poly Silicon, TOX (thermal oxide), Au/Sn solder, or the like, for example, but may be formed of any material that seals cover 10 to substrate 12. Seal material 24, in the example embodiment shown, may initially be positioned on underside 26 of cover 10 and may extend outwardly from underside 26 a distance 30. In another embodiment, seal material 24 may initially be formed on substrate 12 and may extend upwardly from substrate 12 distance 30. Distance 30 may be greater than the distance 18 that the tallest of devices 14 extends upwardly from substrate 12. In other words, seal material 24 may define a height 30 that may be greater than a height 18 of devices 14 such that when cover 10 is secured to substrate 12, cover 10 will not contact devices 14 and, therefore, damage to devices 14 may be reduced compared to prior art sealing methods.

Cover 10 may further include a bonding material 32 positioned on a topside 34 thereof. Bonding material 32 may define a ring 36 of bonding material that extends continuously and around selected central region 20 of substrate 12 when the seal material 24 is sealed thereto. Bonding material 32, in the example embodiment shown, may initially be positioned on topside 34 of cover 10 and may extend outwardly from topside 34 a distance 38. In another embodiment, bonding material 32 may initially be formed on a bonding platen 44 that may be moved into contact with topside 34 of cover 10. Distance 38 may be sufficient to transmit a force from a bonding platen 44 through cover 10 and to sealing material 24 in the area of ring 28 of seal material 24 such that substrate 12 is not bent or otherwise deformed in shape within selected central region 20. In other words, bonding material 32 may be aligned across cover 10 from ring of seal material 24 such that a force from a bonding platen 44 is transferred through cover 10 to seal material 24 define a localized sealing force 48 in the area of seal material 24. Such a localized force 48 in the ring region 28 of seal material 24 may reduce bending or deflection of cover 10 such that cover 10 will not contact devices 14 and, therefore, damage to devices 14 may be reduced compared to prior art sealing methods.

Figure 2:
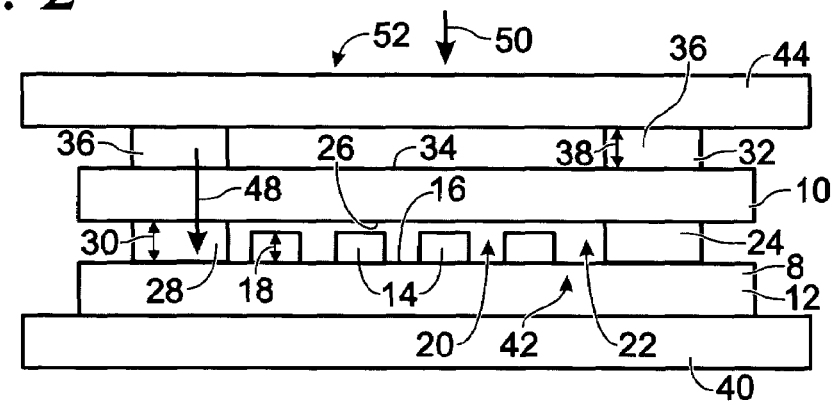
FIG. 2 shows a schematic side cross-sectional view of one embodiment of a wafer bonding method wherein a cover is bonded to a substrate.

As shown in FIG. 2, the method of sealing cover 10 to substrate 12, so as to seal device 14 within interior sealing region 22, will now be described. Substrate 12 may be positioned on a first bonding platen 40. Cover 10 may then be positioned above substrate 12 such that underside 26 of cover 10 is positioned adjacent exposed surface 16 of substrate 12 and such that ring 28 of seal material 24 is aligned with an edge region 42 of selected central region 20. In other words, ring 28 of seal material 24 is positioned surrounding devices 14. In this position of cover 10, top side 34 of cover 10 is positioned opposite cover 10 from substrate 12, i.e., top side 34 is positioned on the other side of cover 10 from substrate 12. Bonding material 32 on top side 34 of cover 10 is aligned with seal material 24 through cover 10. A second bonding platen 44 is then positioned above top side 34 of cover 10. Second bonding platen 44 is then moved toward first bonding platen 40 a distance and with a force sufficient to seal material 24 to substrate 12. In other embodiments, first bonding platen 40 may be moved toward second bonding platen 44 or both platens 40 and 44 may be moved toward each other to seal seal material 24 to substrate 12.

The force 48 applied to cover 10 by substantially planar second bonding platen 44 is localized at bonding material 32 because second bonding platen 44 contacts cover 10 only at ring 36 of bonding material 32. Accordingly, the force 48 from second bonding platen 44 is applied to substrate 12 only at seal material 24, which is aligned with bonding material 32. In this manner, cover 10 is not substantially bent or otherwise deformed by the bonding force of second bonding platen 44 such that cover 10 does not bend downwardly in a direction 50 within a central region 52 of cover 10 and does not contract or damage devices 14 on substrate 12. In other words, second bonding platen 44 may remain substantially planar and in non-contact with microelectrical devices 14 during the bonding process.

Additionally, bonding material 32 may be formed of a soft, pliable material, such as gold, such that ring 36 of bonding material 32 may act to gimbal second bonding platen 44 on cover 10. In other words, the soft, pliable nature of bonding material 32 may allow deformation of bonding material 32 in cases where second bonding platen 44 is not positioned completely parallel with cover 10 such that second bonding platen 44 will deform bonding material 32 until second bonding platen 44 contacts ring 36 of bonding material 32 completely and evenly around ring 36. In this manner, localized bonding force 48 is applied substantially completely and evenly around ring 36 of bonding material 32. In the embodiment wherein bonding material 32 is manufactured of gold and cover 10 is manufactured of glass, an adhesive material may be positioned between glass cover 10 and gold bonding material 32 so as to promote adhesion therebetween. The adhesion material may be Ti, TaAl, TiW or the like. In other embodiments, bonding material 32 itself may be manufactured of any thin film bonding material, such as Ti, TaAl, or TiW, for example. If the bonding material will also be utilized to form alignment targets 46 (see FIG. 4), the bonding material utilized may be opaque.

Figure 3:
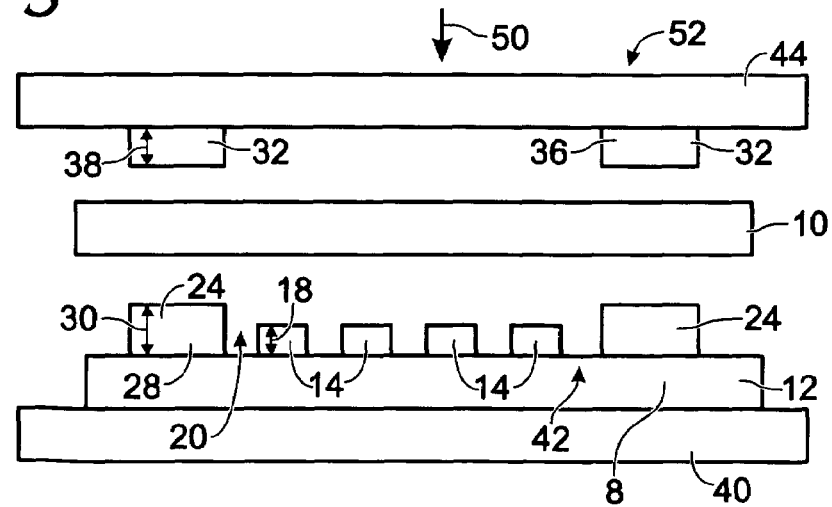
FIG. 3 shows a schematic side cross-sectional view of another embodiment of a wafer bonding method wherein a cover is positioned above a substrate.

FIG. 3 shows another embodiment of a wafer bonding method wherein ring 36 of bonding material 32 is formed on second bonding platen 44 and ring 28 of seal material 24 is initially positioned on substrate 12. In such an embodiment, after bonding of cover 10 to substrate 12 by seal material 24, and after removal of second bonding platen 44, ring 36 of bonding material 32 will not be permanently positioned on cover 10. Accordingly, in such an embodiment, component 8 will not include ring 36 of bonding material 32 on top side 34 of cover 10.

Figure 4:
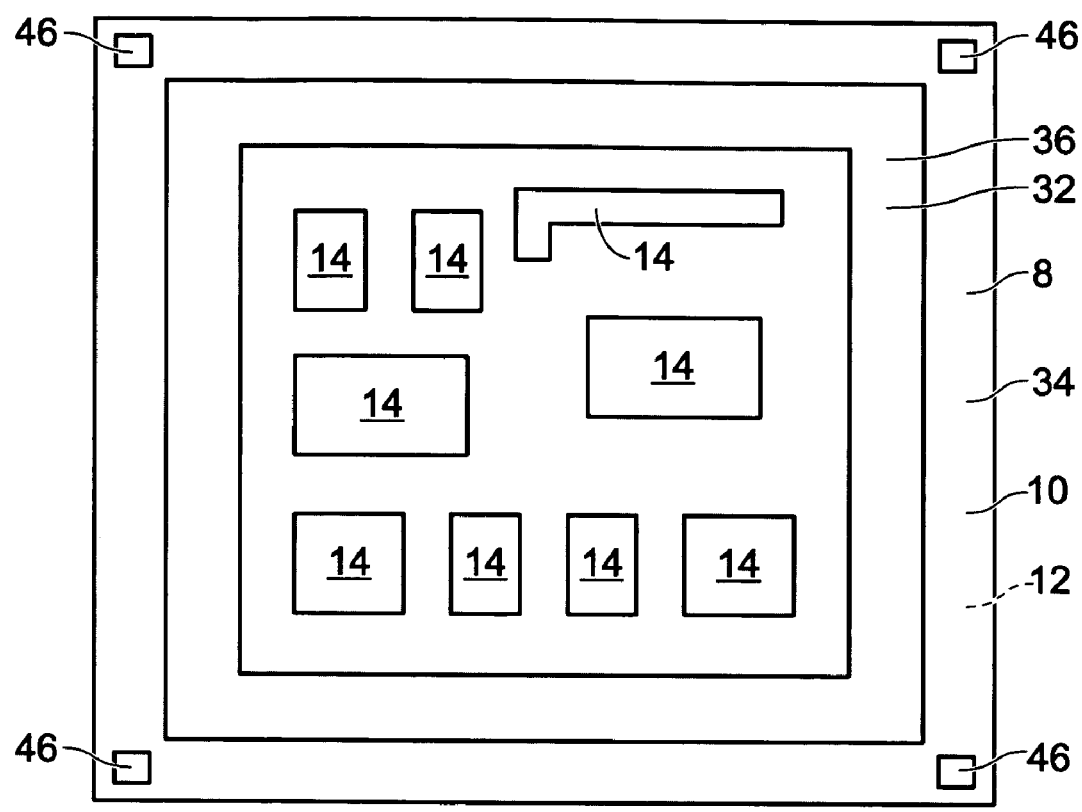
FIG. 4 is a schematic top view of one embodiment of a microelectrical component including a ring of bonding material thereon.

Referring to FIG. 4, a method of forming ring 36 of bonding material 32 will be described. In one embodiment, cover 10 may be manufactured of a somewhat rigid and transparent material, such as glass or the like. A metal film, such as gold or the like, may be deposited completely across top side 34 of cover 10 during, for example, a lithographic deposition process. The metal film may then be masked and etched to form ring 36 of bonding material 32, as well as other desirable features, such as alignment targets 46. This may result in a ring 36 of bonding material 32 being aligned with ring 28 of seal material 24 positioned on underside 26 of cover 10. In other embodiments, other methods of forming bonding material 32 on cover 10 may be utilized. In another embodiment, ring 36 of bonding material 32 may be positioned on second bonding platen 44 such that cover 10 may not have ring 36 of bonding material 32 permanently secured thereto. In this figure, devices 14 are shown positioned in central region 20 on substrate 12 and are viewed through transparent cover 10 secured to substrate 12.

Other variations and modifications of the concepts described herein may be utilized and fall within the scope of the claims below.

What is claimed is:

1. A method of wafer bonding, comprising:
   placing a substrate on a first bonding platen, said substrate including micro electrical devices thereon;
   forming a seal ring around a perimeter region of a first surface of a cover;
   forming a bonding ring around a perimeter region of a second surface of said cover, said second surface opposite from said first surface; and
   moving a second bonding platen toward said first bonding platen and into contact with said bonding ring of said cover so as to seal said seal ring to said substrate, wherein said micro electrical devices are positioned within a central region of said substrate and wherein said seal ring is positioned outside said central region when sealed to said substrate.

2. The method of claim 1 wherein said seal ring and said bonding ring are substantially aligned with one another through said cover.

3. A method of wafer bonding, comprising:
   placing a substrate on a first bonding platen, said substrate including micro electrical devices thereon;
   forming a seal ring around a perimeter region of a first surface of a cover;
   forming a bonding ring around a perimeter region of a second surface of said cover, said second surface opposite from said first surface; and
   moving a second bonding platen toward said first bonding platen and into contact with said bonding ring of said cover so as to seal said seal ring to said substrate wherein said cover is manufactured of a transparent material.

4. A method of wafer bonding, comprising:
   placing a substrate on a first bonding platen, said substrate including micro electrical devices thereon;
   forming a seal ring around a perimeter region of a first surface of a cover;
   forming a bonding ring around a perimeter region of a second surface of said cover, said second surface opposite from said first surface; and
   moving a second bonding platen toward said first bonding platen and into contact with said bonding ring of said cover so as to seal said seal ring to said substrate wherein said seal ring is manufactured of one of TEOS, Amorphous Silicon, Poly Silicon, TOX and Au/Sn solder.

5. A method of wafer bonding, comprising:
   placing a substrate on a first bonding platen, said substrate including micro electrical devices thereon;
   forming a seal ring around a perimeter region of a first surface of a cover;
   forming a bonding ring around a perimeter region of a second surface of said cover, said second surface opposite from said first surface; and
   moving a second bonding platen toward said first bonding platen and into contact with said bonding ring of said cover so as to seal said seal ring to said substrate wherein said bonding ring is manufactured of one of gold, Ti, TaAl and TiW.

6. A method of wafer bonding, comprising:
   placing a substrate on a first bonding platen, said substrate including micro electrical devices thereon;
   forming a seal ring around a perimeter region of a first surface of a cover;
   forming a bonding ring around a perimeter region of a second surface of said cover, said second surface opposite from said first surface; and moving a second bonding platen toward said first bonding platen and into contact with said bonding ring of said cover so as to seal said seal ring to said substrate wherein said bonding ring is manufactured of a soft material that compensates for non-parallel positioning of said second bonding platen and said cover.

7. A method of wafer bonding, comprising:

placing a substrate on a first bonding platen, said substrate including micro electrical devices thereon;

forming a seal ring around a perimeter region of a first surface of a cover;

forming a bonding ring around a perimeter region of a second surface of said cover, said second surface opposite from said first surface; and moving a second bonding platen toward said first bonding platen and into contact with said bonding ring of said cover so as to seal said seal ring to said substrate wherein said second bonding platen is moved toward said first bonding platen with a force sufficient to seal said seal ring to said substrate.

8. A method of wafer bonding, comprising:

placing a substrate on a first bonding platen, said substrate including micro electrical devices thereon;

forming a seal ring around a perimeter region of a first surface of a cover;

forming a bonding ring around a perimeter region of a second surface of said cover, said second surface opposite from said first surface; and moving a second bonding platen toward said first bonding platen and into contact with said bonding ring of said cover so as to seal said seal ring to said substrate wherein during said moving said second bonding platen toward said first bonding platen and into contact with said bonding ring of said cover, said second bonding platen remains substantially planar and in non-contact with said micro electrical devices and said cover.

* * * * *